March 31, 1964 C A CRAWFORD 3,126,549

RAPID COMPONENT INSERTION APPARATUS

Filed Sept. 28, 1960

United States Patent Office 3,126,549
Patented Mar. 31, 1964

3,126,549
RAPID COMPONENT INSERTION APPARATUS
C A Crawford, Hicksville, N.Y., assignor to Hazeltine Research, Inc., a corporation of Illinois
Filed Sept. 28, 1960, Ser. No. 59,051
3 Claims. (Cl. 1—321)

Figure 1:
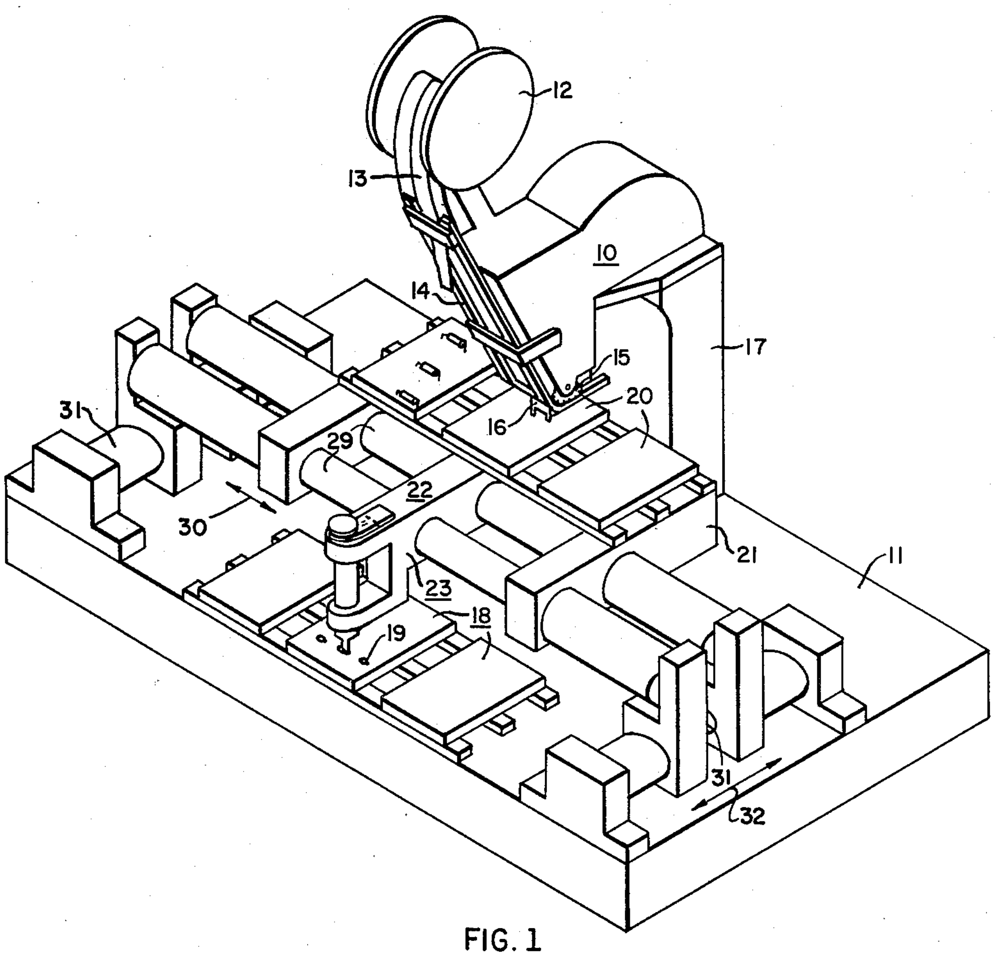

This invention is concerned with a rapid component insertion apparatus for inserting components in printed circuit boards.

Extensive use of printed circuits has made it possible to package many electrical components in a small space. The use of low power active circuit elements (e.g. transistors) has made it possible to utilize smaller components and thereby further decrease space requirements for electrical circuits.

However, this decrease in component size and packaging space has made it increasingly difficult to handle and assemble these components and printed circuits. Mechanical component insertion devices have been developed which speed up the process and thereby alleviate the difficulty to some extent. However, these devices require the operator to manually position the board with respect to the insertion apparatus. Although, in a typical installation of such a machine the component insertion rate may be increased, for example, from 120 per hour by hand to 300 per hour by the machine, it is still possible for the operator to insert the component in the wrong holes in the board. A further increase in speed is also desirable.

It is an object of the present invention, therefore, to provide an arrangement which substantially avoids one or more of the limitations of the described prior arrangements.

It is a further object of the present invention to provide a rapid component insertion apparatus for inserting components in printed circuit boards in only the correct holes.

In accordance with the invention, a rapid component insertion apparatus for inserting components in printed circuit boards comprises means for mechanically inserting the component into holes in a printed circuit board, indexing means fixed with respect to the insertion means to indicate where components are to be inserted, movable support means for holding the board and positioning it with respect to the insertion means and sensing and activating means for activating the insertion means only when the support means is correctly positioned with respect to the indexing means.

For a better understanding of the present invention, together with other and further objects thereof, reference is had to the following description taken in connection with the accompanying drawing, and its scope will be pointed out in the appended claims.

Figure 2:
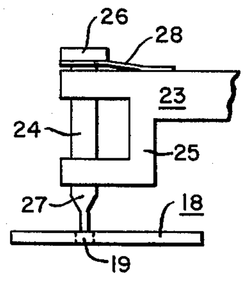

In the drawing:

FIG. 1 is a schematic of a component insertion apparatus embodying the present invention, and FIG. 2 is an elevation view of the sensing and activating means shown in FIG. 1.

In FIG. 1, a mechanical component insertion means 10 is fixed to a base 11. This component insertion means could be any of a number of commercially available machines and, in general, includes a spool 12, a continuous belt of components 13 attached to the spool, a component guide 14, component feed means 15, an insertion head 16 and housing and support means 17. A component insertion means of the type shown generally in FIG. 1 is more fully described in United States Patent No. 2,896,213 granted July 28, 1959, to L. D. Alderman et al.

An indexing means 18 which is shown in the FIG. 1 embodiment as a template in which index holes 19 are located, is fixed relative to the insertion means 10 on the base 11.

A printed circuit board 20 is mounted on movable support means 21. The support means 21 is made movable, for example, by connecting it to a cross-slide positioning device 22 mounted on the base 11. As shown, cross-slide positioning device 22 includes two pairs of orthogonally oriented rods carrying sets of slidable bearing blocks. Support means 21 is thus slidably mounted on rods 29 so as to allow a lateral motion as indicated by arrow 30 and rods 29 are in turn slidably mounted on rods 31 so as to allow a transverse motion as indicated by arrow 32. Rods 29 and 31 are of uniform diameter over their lengths; the inclusion of protective coverings enclosing the end portions of the rods in the drawing should not be interpreted as a variation in rod diameter.

A hand grip 23 is connected to the support means 21 and, as shown in FIG. 2, the hand grip 23 includes a sensing and activating means 24 which is slideably mounted in U-shaped member 25 and includes a button-shaped top 26 and a cylindrical pin 27 at the bottom. A spring member 28 is attached to U-shaped member 25 and extends under the button-shaped top 26.

*Operation*

The apparatus shown in FIG. 1 operates in the following manner. The components 13 which are to be inserted into board 20 are wound in a continuous belt around spool 12 and may be held together, for example, by a strip of adhesive tape (not shown). The components 13 are threaded through a component guide 14 to a component feed means 15 which is shown in FIG. 1 as a cog wheel which engages the component leads and thereby feeds the belt of components 13 to an insertion head 16. The insertion head 16, which is driven by power means (not shown) contained in the housing and support means 17, grasps one of the components 13 and inserts its leads into the printed circuit board 20. The board 20 rests upon movable support means 21 and is positioned with respect to the insertion head 16 by an operator who grasps the hand grip 23 and, by means of the cross-slide positioning device 22, is able to move the entire support means 21 along with the board 20 in any direction in a horizontal plane. The operator is able to accurately position the board 20 with respect to the head 16 by moving the sensing and activating means 24 over the indexing means 18 which is shown here as a template through which holes 19 have been drilled.

Sensing and activating means 24 is arranged such that the pin 27 at its bottom end normally rides just above or on the surface of indexing means 18. When pin 27 is over a hole 19, and only then, the button 26 can be depressed which, in turn, pushes down on spring member 28. Member 28 closes a microswitch (not shown) which activates the insertion head 16.

In this manner, components are inserted rapidly and can be inserted only in the correct holes. In actual operation of this invention, an increase from 300 component insertions per hour to 600 component insertions per hour has been realized over prior devices.

While there has been described what is at present considered to be the preferred embodiment of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A rapid component insertion apparatus for inserting components in printed circuit boards comprising: means for mechanically inserting a component into holes in a printed circuit board; indexing means fixed relative to said component insertion means for indicating where components are to be inserted in said board; movable support means for holding said printed circuit board and positioning it relative to said insertion means; and sensing and activating means for activating said insertion means only when said support means is correctly positioned with respect to said indexing means.

2. A rapid component insertion apparatus for inserting components in printed circuit boards comprising: means for mechanically inserting a component into holes in a printed circuit board; a template for indicating where components are to be inserted in said board; support means for holding a printed circuit board; a cross-slide positioning device coupled to said support means for positioning said support means relative to said component insertion means; and sensing and activating means coupled to said support means for activating said insertion means only when said support means is correctly positioned with respect to said template.

3. A rapid component insertion apparatus for inserting components in printed circuit boards comprising: means for mechanically inserting a component into holes in a printed circuit board; a template for indicating where components are to be inserted in said board; support means for holding a printed circuit board; a cross-slide-positioning device coupled to said support means for positioning said support means relative to said component insertion means; and a switching device mounted on said support means for activating said insertion means only when said switching device is positioned over an indexing hole in said template.

No references cited.